United States Patent [19]
Kuramochi et al.

[11] Patent Number: 5,471,949
[45] Date of Patent: Dec. 5, 1995

[54] APPARATUS FOR PRODUCING SILICON SINGLE CRYSTAL

[75] Inventors: Kaoru Kuramochi; Makoto Ito; Kiichiro Kitaura, all of Amagasaki, Japan

[73] Assignee: Sumitomo Sitix Corporation, Amagasaki, Japan

[21] Appl. No.: 330,785

[22] Filed: Oct. 28, 1994

Related U.S. Application Data

[62] Division of Ser. No. 588,171, Sep. 26, 1990, Pat. No. 5,392,729.

[30] Foreign Application Priority Data

Sep. 29, 1989 [JP] Japan ................................ 1-255849

[51] Int. Cl.⁶ .................................................. C30B 35/00
[52] U.S. Cl. ............................ 117/208; 117/13; 117/213
[58] Field of Search ................................ 117/13, 20, 31, 117/208, 213, 214, 932, 944

[56] References Cited

U.S. PATENT DOCUMENTS

| | | | |
|---|---|---|---|
| 4,235,848 | 11/1980 | Sokolov et al. | 117/216 |
| 4,350,557 | 9/1982 | Scholl et al. | 117/15 |
| 4,609,425 | 9/1986 | Mateika et al. | 117/31 |
| 4,894,206 | 1/1990 | Yamashita et al. | 117/213 |

FOREIGN PATENT DOCUMENTS

| | | |
|---|---|---|
| 0140509 | 10/1988 | European Pat. Off. . |
| 0032100 | 2/1983 | Japan . |
| 0140392 | 8/1983 | Japan . |
| 0227986 | 10/1986 | Japan . |
| 62-197397 | 1/1987 | Japan . |
| 3215587 | 9/1988 | Japan . |
| 0294758 | 12/1988 | Japan . |
| 1042388 | 2/1989 | Japan . |
| 64-76992 | 3/1989 | Japan . |
| 0294588 | 11/1989 | Japan . |
| 2084046 | 4/1982 | United Kingdom . |

OTHER PUBLICATIONS

Keigo Hoshikawa et al., "Low Oxygen Content Czochralski Silicon Crystal Growth", *Japanese Journal of Applied Physics*, vol. 19, No. 1, Jan. 1980, pp. L33–36.

T. Suzuko et al., "CZ Silicon Crystals Grown in a Transverse Magnetic Field", Sony Corp. Semiconductor Div. Japan 243, pp. 90–100.

"The Dissolution Rate of Silica in Molten Silicon" by Hiroshi Hirata et al., *Japan Journal of Applied Physics*, vol. 19, No. 8 (1980).

*Primary Examiner*—R. Bruce Breneman
*Assistant Examiner*—Felisa Garrett
*Attorney, Agent, or Firm*—Burns, Doane, Swecker & Mathis

[57] ABSTRACT

A method of producing a silicon single crystal, in which a cylindrical partition is immersed in a molten pure silicon liquid or molten silicon liquid containing a Sb dopant within a crucible and the molten liquid inside the partition is pulled up from the crucible to produce the silicon single crystal, wherein an interval between a lower end of the partition and a crucible bottom is changed to control an oxygen concentration in the pulling-up silicon single crystal. The interval is reduced in the case where the oxygen concentration in the pulling-up silicon single crystal is to be increased while the interval is increased in the case where the oxygen concentration is to be reduced.

15 Claims, 4 Drawing Sheets

APPARATUS FOR PRODUCING SILICON SINGLE CRYSTAL

This application is a divisional of application Ser. No. 07/588,171, filed Sep. 26, 1990, now U.S. Pat. No. 5,392,729.

BACKGROUND OF THE INVENTION

1. Field of the Invention

The present invention relates to a method of producing a silicon single crystal by the Czochralski method (hereinafter referred to as the CZ method).

2. Description of Related Art

It is a general practice in producing a silicon single crystal by the CZ method that raw materials put in a crucible, for example, inside a chamber are heated and melted by a heater, and then a seed crystal is dipped in this molten liquid and pulled upwards while it is being rotated, whereby a silicon single crystal grows at the lower end of the seed crystal.

In the case where a semiconductor integrated circuit is manufactured by the use of a silicon single crystal substrate, in order to give an appropriate electric conductivity to the substrate, it has been required to contain an adequate amount of dopants, such as antimony (Sb), boron (B) and phosphorous (P). In addition, an adequate amount of oxygen should be contained in the substrate of silicon single crystal so as to gain a so-called Intrinsic Gettering (IG) effect. "Gettering" means a process that removes harmful impurities, e.g. heavy metals, from the regions in a wafer where devices are fabricated. "Wafer" means disk-shaped substrate. IG uses the defects associated with oxygen precipitation in the interior of the wafer, for trapping sites for the harmful impurities. (S. M. Sze, "VLSI Technology" §1.5.1. McGraw Hill, 1983). Therefore, if the silicon single crystal is employed for a substrate, oxygen of a proper and uniform concentration is necessary. For this purpose, the oxygen concentration in the molten liquid of raw materials in the crucible should be controlled.

The oxygen which is supplied into the molten liquid from the surface of the quartz crucible through contact therebetween is stirred by a forced convection of the molten liquid due to the rotation of the crucible and a heat convection of the molten liquid due to the temperature difference thereof in the crucible. During stirring, the oxygen is not only evaporated from the surface of the liquid in the form of silicon monoxide (SiO), but is carried to the growth surface of the silicon single crystal and taken thereinto.

As one method to control the oxygen concentration taken in the silicon single crystal, Japanese Patent Laid-open Publication Nos. 57-27996 (27996/1982) and 57-135796 (135796/1982) disclose, with noting the relation between the rotation rate of the crucible and the oxygen concentration in the silicon single crystal, changing the rotation rate of the crucible in relation to the amount of the molten silicon liquid, thereby changing the relative speed of the quartz crucible and molten silicon liquid, which results in a forced convection of the molten silicon liquid. Thus, it becomes possible to adjust the thickness of a boundary layer where the oxygen is diffused in the surface of the quartz crucible by the forced convection of the molten liquid. Japanese Patent Laid-open Publication No. 62-153191 (153191/1987) discloses another method, wherein the contact area between the quartz crucible and molten silicon liquid and the temperature of the molten silicon liquid are changed. Specifically, according to this latter method, while the supplying ratio of electric power to a plurality of heaters provided in the periphery of side walls of the crucible is adjusted, and accordingly a part of the raw materials are kept in the solid state in the crucible, the silicon single crystal is grown.

Recently, in order to produce a silicon single crystal substrate capable of being precisely processed with an increase of the integration degree of semiconductor integrated circuit, Sb has been used as the dopant to be added to the silicon single crystal substrate in many cases. However, a problem has occurred in that the oxygen concentration in the silicon single crystal doped with Sb is lower than that in the silicon single crystal without dopants or the silicon single crystal with other dopants, for example B and P, so that it is difficult to make the oxygen concentration in the silicon single crystal high ($15 \times 10^{17}$ atoms/cm$^3$ or more) sufficient for obtaining the IG effect by the above-described method of controlling the oxygen concentration.

This is based on a property that a vapor pressure of diantimony trioxide ($Sb_2O_3$) formed by the addition of Sb is higher than that of SiO, so that $Sb_2O_3$ is easily evaporated from the surface of the molten silicon liquid. It has not been possible to solve this problem by the above-described method of controlling the oxygen concentration.

SUMMARY OF THE INVENTION

The present inventors have thought as follows:

In the CZ method, the molten silicon liquid is heated by means of a graphite heater surrounding the crucible and a flow as shown by an arrow in FIG. 1 is formed within the molten silicon liquid by the forced convection resulting from the rotation of the crucible and the heat convection resulting from the temperature difference in combination. That is to say, the convection within the crucible occurs so that the molten silicon liquid having a high oxygen concentration may be supplied from the side of a side circumferential wall of the crucible to the surface of the molten silicon liquid. Here, in the case where Sb is added to the molten silicon liquid as the dopant, a part of Sb added acts upon oxygen supplied from the surface of the quartz crucible to be turned into oxides such as $Sb_2O_3$. Since $Sb_2O_3$ has a vapor pressure similar to that of Sb but higher than that of SiO supplied from the surface of the quartz crucible, a quantity of oxygen evaporated from the surface of the molten silicon liquid becomes larger than that in the case where Sb is not added.

Accordingly, in the case where Sb is added, the molten silicon liquid evaporates $Sb_2O_3$ from the surface thereof in the process, in which the molten silicon liquid is supplied to the single crystal-growing zone by the above-described convection, and thus the oxygen concentration in the silicon single crystal is reduced.

In the conventional method, in which a rotation rate of the quartz crucible is changed, and the method, in which a contact area between the quartz crucible and the molten silicon liquid and a temperature of the molten silicon liquid is changed, there is no fundamental difference in convection condition and the molten silicon liquid, from which $Sb_2O_3$ has been evaporated, is supplied to the silicon single crystal-growing zone, so that the oxygen concentration in the silicon single crystal is reduced with an increase of the concentration of Sb. It has been however, known that the oxygen concentration is increased at a portion where the crucible is brought into contact with the molten silicon liquid. Accordingly, if the convection in the molten silicon liquid is controlled so that the molten silicon liquid having a high oxygen concentration in the bottom portion of the crucible may be supplied to the silicon single crystal-growing zone in an upper portion of the crucible without passing through the surface of the molten silicon liquid where the evaporation is violently carried out, the oxygen concentration in the silicon single crystal can be increased.

A method of producing a silicon single crystal according to the present invention is characterized in that when a cylindrical partition is immersed in a molten silicon liquid within a crucible so as to immovably fixed relative to the crucible and the molten silicon liquid inside the partition is pulled up from the crucible to produce the silicon single crystal, an oxygen concentration in the silicon single crystal is controlled by changing an interval between a lower end of the partition and a crucible bottom. Concretely speaking, in the case where the oxygen concentration in the silicon single crystal to be pulled up is increased, the interval is reduced while in the case where the oxygen concentration in the silicon single crystal to be pulled up is reduced, the interval is increased. In addition, antimony (Sb) may be put in the crucible as a dopant.

If the partition is disposed in the molten silicon liquid, as to a convection inside the partition, an ascending flow resulting from a heat convection is enhanced and thus the molten silicon liquid having a high oxygen concentration in a bottom portion of the crucible is preferentially supplied to a silicon single crystal-drawing zone without passing through a surface of the molten silicon liquid where $Sb_2O_3$ is violently evaporated. Furthermore, the molten silicon liquid outside the partition is difficult to mingle with the molten silicon liquid inside the partition and thus a temperature of the molten silicon liquid outside the partition is higher than that of the molten silicon liquid inside the partition by heating by means of an outside graphite heater. As a result, a quantity of oxygen dissolved from the crucible or the partition is increased to form the molten silicon liquid having a high oxygen concentration. And, the molten silicon liquid having a high oxygen concentration is gradually supplied to the inside of the partition as the silicon single crystal is pulled up. As above described, the provision of the cylindrical partition leads to the possibility of increasing the oxygen concentration in the silicon single crystal by a synergistic effect of the enhancement of the ascending flow resulting from the heat convection inside the partition and the supply of the molten silicon liquid having a high oxygen concentration.

It is one object of the present invention to provide a method of producing a silicon single crystal capable of easily controlling an oxygen concentration in the silicon single crystal.

It is another object of the present invention to provide a method of producing a silicon single crystal capable of producing a silicon single crystal having a high oxygen concentration even in the case where antimony (Sb) is added as a dopant.

It is a further object of the present invention to provide a method of producing a silicon single crystal capable of producing a silicon single crystal having a high oxygen concentration sufficient for obtaining the IG effect.

It is a still further object of the present invention to provide a method of producing a silicon single crystal capable of producing a silicon single crystal optimum for a substrate for use in a semiconductor integrated circuit.

The above and further objects and features of the invention will more fully be apparent from the following detailed description with accompanying drawings.

DESCRIPTION OF THE PREFERRED EMBODIMENTS

The preferred embodiments of the present invention will be below described with reference to the drawings.

Figure 1:
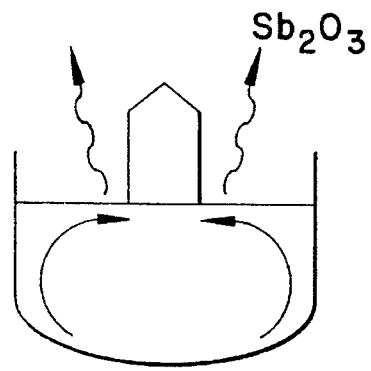
FIG. 1 is a diagram showing a convection of a molten silicon liquid within a crucible according to the conventional method.
Figure 2:
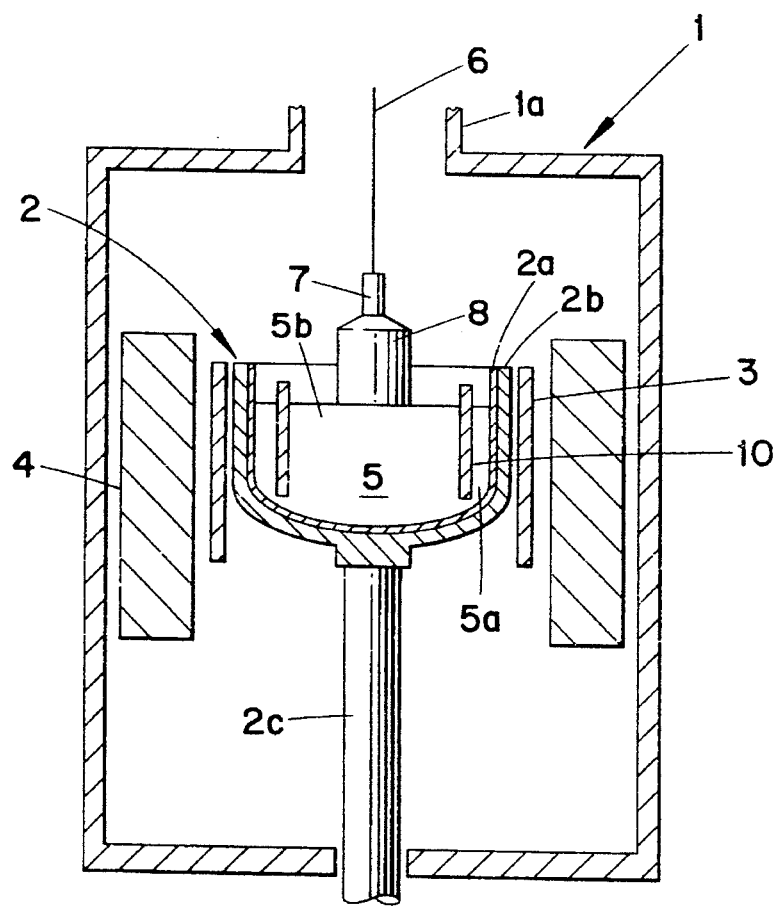
FIG. 2 is a schematic longitudinal sectional view showing a working condition of the present invention.

Referring now to FIG. 2, reference numeral 1 designates a chamber set at an appointed vacuum. A crucible 2 is disposed at a center within the chamber 1. A graphite heater 3 is disposed outside the crucible 2 and a heat reserving member 4 is disposed concentrically between the graphite heater 3 and the chamber 1, respectively. The crucible 2 has a double structure in which an outer crucible 2b made of graphite is arranged around an outer circumference of an inner crucible 2a made of quartz. An upper end of a supporting shaft 2c passing through a bottom portion of the chamber 1 is connected with a center of a bottom portion of the crucible 2 so that the crucible 2 may go up and down with revolving by means of the supporting shaft 2c. A storage case (not shown) for storing a dopant is disposed above the crucible 2 so that the Sb dopant may be put in the crucible 2 by opening a bottom cover of the storage case by means of switchgear means (not shown). In addition, the crucible 2 is filled with a molten silicon liquid 5 obtained by heating and melting polycrystalline silicon by means of the graphite heater 3.

A guard cylinder 1a for guarding a silicon single crystal which serves also as a supply pipe of an ambient atmosphere gas into the chamber 1 is erected at the center of the upper wall of the chamber 1. A rotation and up-and-down mechanism (not shown) is provided above the guard cylinder 1a, to which is coupled an upper end of a lift axis 6. A seed crystal 7 seized by a chuck is hung down from a lower end of the lift axis 6. The seed crystal 7 is, after being dipped into the molten silicon liquid 5 within the crucible 2, raised upwards while being rotated, so that a silicon single crystal 8 is grown at the lower end of the seed crystal 7.

An oxygen concentration-controlling ring 10 as a cylindrical partition formed of a heat-resisting member, such as quartz and ceramics, and having the following outside diameter and thickness is immersed in said molten silicon liquid 5 outside the silicon single crystal 8 so that there may be a suitable interval between a lower end thereof and an inside bottom surface of the inner crucible 2a and an upper end thereof may be projected from a surface of the molten silicon liquid 5. The molten silicon liquid 5 is divided into an outside molten silicon liquid 5a and an inside molten silicon liquid 5b by means of the controlling ring 10.

It is desirable that the outside diameter of the controlling ring 10 is 60 to 90%, preferably about 75%, of an outside diameter of the inner crucible 2a. If the outside diameter of the controlling ring 10 is too small relative to the outside diameter of the inner crucible 2a, there is the possibility that the inside molten silicon liquid 5b, that is, the molten silicon liquid within a growing zone of the silicon single crystal 8, will fluctuate in temperature, which is disadvantageous for the nondislocation pulling-up of the silicon single crystal 8. If the outside diameter of the controlling ring 10 is too large relative to the outside diameter of the inner crucible 2a, a quantity of oxygen evaporated from a surface of the inside molten silicon liquid 5b is increased and thus it is difficult to increase an oxygen concentration in the inside molten silicon liquid 5b up to a level required for the IG effect. In addition, it is desirable that the thickness of the controlling ring 10 is 5 to 20 mm, preferably 7 to 8 mm. If the thickness of the controlling ring 10 is too small, the controlling ring 10 is deformed by the molten silicon liquid 5 and a distribution of temperature in the inside molten silicon liquid 5b is uneven on concentric circles. If the thickness of the controlling ring 10 is too large, there is the possibility that the inside molten silicon liquid 5b will fluctuate in temperature, which is disadvantageous for the nondislocation pulling-up of the silicon single crystal 8.

Figure 3:
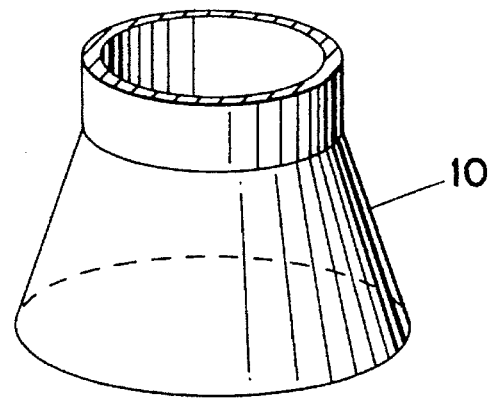
FIGS. 3 and 4 are schematic perspective views showing another preferred embodiment of a controlling ring as a partition used in a method according to the present invention.
Figure 4:
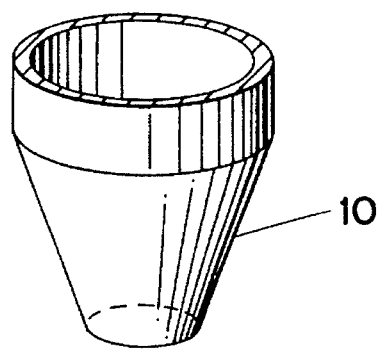

As to a form of the controlling ring 10, an upper portion thereof is cylindrical and a portion in succession to the upper portion may be increased or reduced in diameter toward a lower end, as shown in FIG. 3 or FIG. 4. The cylindrical controlling ring need not be limited to merely one. Rather, a plurality of controlling rings can be arranged on concentric circles to control the oxygen concentration in the single crystal.

Figure 5:
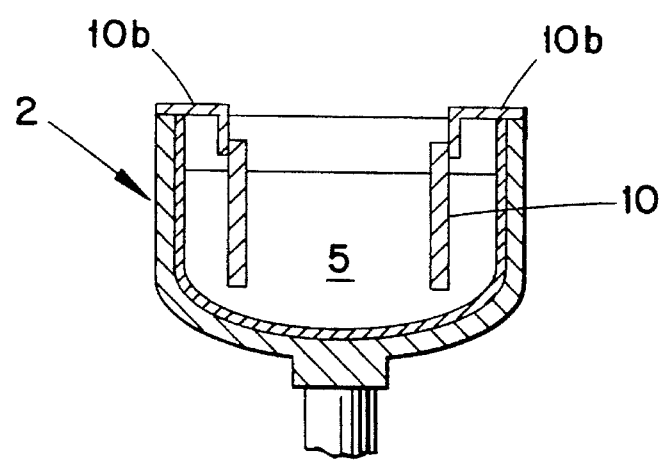
FIGS. 5 and 6 are schematic longitudinal sectional views showing a method of holding the controlling ring.
Figure 6:
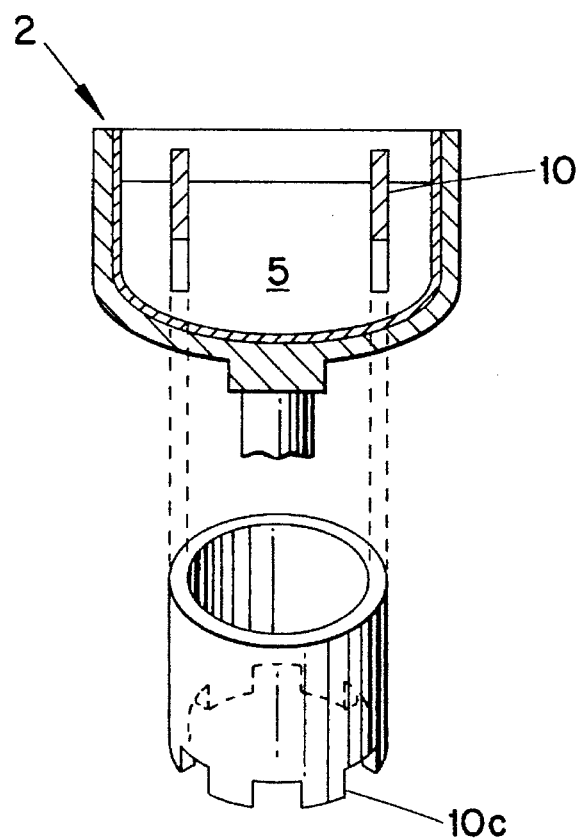

Various methods of holding the controlling ring 10 with the suitable interval from the inside bottom surface of the crucible 2 as shown in FIGS. 5 and 6 are possible. The controlling ring 10, which is held by the following methods at an upper portion thereof, is immersed in the molten silicon liquid 5 put in the crucible 2. In the method shown in FIG. 5, jigs 10b, 10b having a L letter-like section made of graphite are mounted on an edge of the crucible 2 so that long sides thereof may be opposite to the surface of the molten silicon liquid 5 and short sides thereof may be directed to the molten silicon liquid 5 to hang the controlling ring 10 by means of end portions of the short sides. In the method shown in FIG. 6, the controlling ring 10 is provided with a plurality of leg portions 10c at a lower end thereof, as shown in FIG. 6, to stand the controlling ring 10 on the bottom wall of the crucible 2 with the suitable interval by means of the leg portions 10c.

In operation, at first polycrystalline silicon as raw materials is charged into the crucible 2 which is then made molten by means of the graphite heater 3 followed by immersing the seed crystal 7 in the molten silicon liquid 5 and ascending the seed crystal 7 with revolving to start the growth of the silicon single crystal 8.

Figure 7:
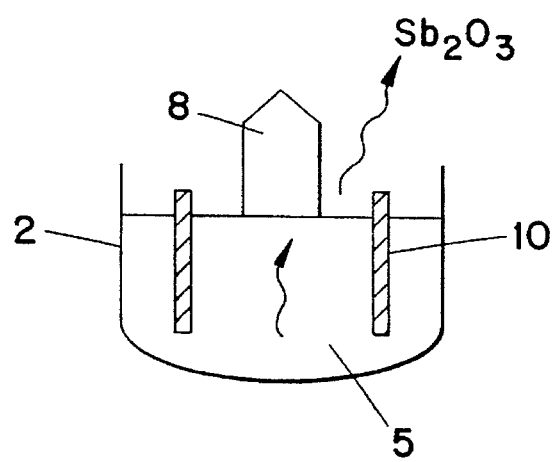
FIG. 7 is a diagram showing a convection of a molten silicon liquid within a crucible according to the present invention.

In this time, if the interval between the controlling ring 10 and the inside bottom surface of the crucible 2 is small, a mixing degree of the outside molten silicon liquid 5a with the inside molten silicon liquid 5b is reduced. Accordingly, a temperature of the outside molten silicon liquid 5a closer to the graphite heater 3 becomes higher than that of the inside molten silicon liquid 5b as the silicon single crystal 8 is grown and thus a quantity of dissolution of the inner crucible 2a and the controlling ring 10 is increased, whereby forming the molten silicon liquid having a high oxygen concentration. As the silicon single crystal 8 is pulled up from the inside molten silicon liquid 5b, the outside molten silicon liquid 5a having a high temperature and a high oxygen concentration is flown to the inside molten silicon liquid 5b having a low temperature. As to the distribution of temperature in the inside molten silicon liquid 5b, the temperature is high in the lower portion while the temperature is low in the upper portion by a synergistic effect of a heating from the graphite heater 3 through the outer crucible 2b and this inflow and thus an ascending flow resulting from a heat convection is enhanced to form a convection as shown in FIG. 7. This convection takes a part in supplying the silicon single crystal-growing zone with the molten silicon liquid having a high oxygen concentration in the bottom portion of the crucible 2 without evaporating oxygen from the surface of the molten silicon liquid to increase the oxygen concentration in the silicon single crystal 8. Accordingly, even in the case where Sb is added as the dopant, the oxygen concentration in the silicon single crystal 8 can be increased up to one sufficient for obtaining the IG effect.

On the contrary, if the interval between the controlling ring 10 and the inside bottom surface of the crucible 2 is large, the mixing degree of the outside molten silicon liquid 5a with the inside molten silicon liquid 5b is increased. Accordingly, not only the ascending flow resulting from the heat convection within the controlling ring 10 is weakened but also the oxygen concentration in the molten silicon liquid supplied from the outside area of the controlling ring 10 is reduced and thus the oxygen concentration in the silicon single crystal 8 is reduced. Particularly, in the case where Sb is added, the quantity of oxygen evaporated in the form of $Sb_2O_3$ is increased and thus the oxygen concentration in the silicon single crystal 8 is still further reduced.

ILLUSTRATIVE EXAMPLE

The silicon single crystal 8 with Sb added as the dopant was produced with $16 \times 10^{17}$ atoms/cm$^3$ as the desired value of the oxygen concentration in the silicon single crystal 8 by the use of an apparatus (the diameter of the crucible 2: 16 inches ) as shown in FIG. 2.

A pressure within the chamber 1 was set at 10 Torr and the silicon single crystal 8 having a diameter of 6 inches was pulled up at 1.0 mm/min with revolving the crucible 2 at a rotation rate of 10 r.p.m. and the seed crystal 7 at a rotation rate of 20 r.p.m. in the directions opposite to each other. In addition, the cylindrical controlling ring 10 made of quartz having a diameter of 300 mm and a thickness of 8 mm was immersed in the molten silicon liquid 5 with the interval of 5 mm and 15 mm, respectively, from the inside bottom surface of the crucible 2. As a result, the longitudinal distribution of specific resistance of the silicon single crystal 8 was held in a range of 0.015± 0.001 Ω·cm on account of the balanced evaporation and segregation of the Sb dopant.

Figure 8:
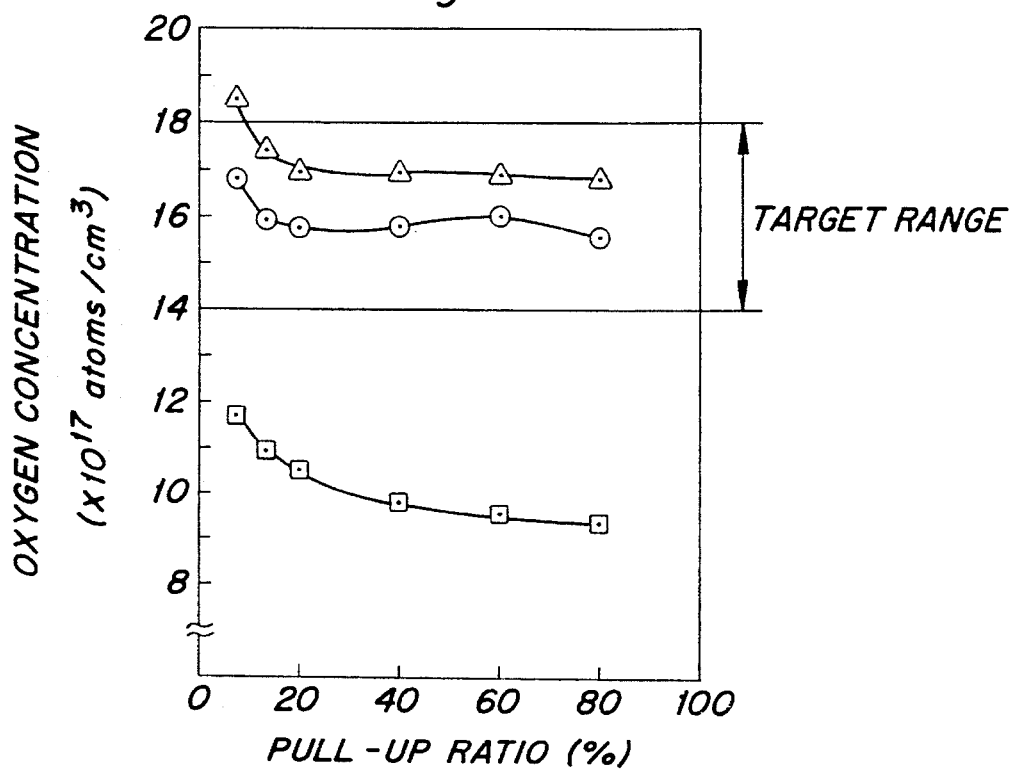
FIG. 8 is a graph showing a relation between a pull-up ratio of a silicon single crystal and an oxygen concentration in the silicon single crystal.

FIG. 8 shows a relation between the pull-up ratio (a ratio of a distance from the side end portion of the seed crystal 7 to a total length of the silicon single crystal 8) and the oxygen concentration in the silicon single crystal 8 in the case where the specific resistance was made constant (0.015 Ω·cm). An axis of ordinate indicates the oxygen concentration, an axis of abscissa indicating the pull-up ratio of the silicon single crystal 8, marks in the graph indicating the results in the case where the interval between the controlling ring 10 and the inside bottom wall of the crucible 2 is set at 5 mm, marks ⊙ indicating the results in the case where this interval is set at 15 mm, and marks indicating the results in the case where the controlling ring 10 is not used. As obvious from this graph, in the case where the controlling ring 10 is used, the silicon single crystal 8 having a high oxygen concentration exceeding the desired value of the oxygen concentration ($16 \times 10^{17}$ atoms/cm$^3$) was obtained.

Figure 9:
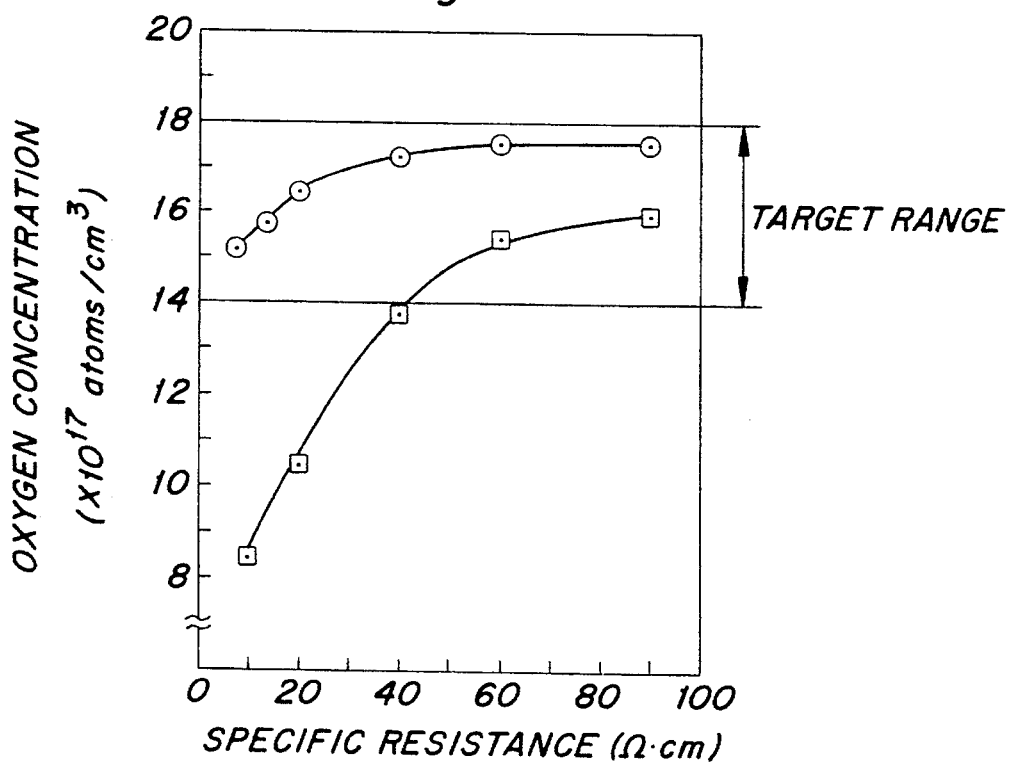
FIG. 9 is a graph showing a relation between a specific resistance and the oxygen concentration in the silicon single crystal.

Besides, the relation between the specific resistance and the oxygen concentration in the silicon single crystal 8 is shown in FIG. 9. An axis of ordinate indicates the oxygen concentration and an axis of abscissa indicates the specific resistance. Marks indicate the results in the case where the controlling ring is not used (the conventional method) and marks ⊙ indicate the results in the case where the controlling ring 10 is used and the interval between the controlling ring 10 and the inside bottom surface of the crucible 2 is set at 15 mm (the method according to the present invention). The measurements are conducted at the position where the initial molten silicon liquid is 45 kg and the pull-up ratio is 33%.

As a result, in the case where the interval is set at 15 mm, the desired value of the oxygen concentration can be uniformly obtained in the axial direction of the silicon single crystal 8 and thus the IG effect can be obtained.

As above described, in the method according to the present invention, the oxygen concentration in the silicon single crystal 8 can be easily increased or reduced by immersing the controlling ring 10 as the cylindrical partition in the molten silicon liquid 5 to control the convection within the molten silicon liquid 5, whereby changing the oxygen concentration in the outside molten silicon liquid 5a supplied to the silicon single crystal-growing zone.

In addition, although antimony (Sb) is added as the dopant in the above-described preferred embodiment, it goes without saying that the method according to the present invention can be applied also to the case where the silicon single crystal is pulled up without adding dopants.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. An apparatus for producing a silicon single crystal, comprising:

a crucible for containing molten silicon;

a cylindrical partition within the crucible with a lower end of the partition separated from a bottom of the crucible by a set distance;

pulling up means for pulling up a silicon single crystal from molten silicon liquid in the crucible at a position located inside the cylindrical partition; and setting means for immovably fixing the partition relative to the crucible such that the set distance between the lower end of said partition and said crucible bottom can be adjusted to control an oxygen concentration in the silicon single crystal pulled-up from the melt.

2. The apparatus as set forth in claim 1, wherein said partition is a heat-resisting member made of quartz or ceramics.

3. The apparatus as set forth in claim 1, wherein said crucible is composed of an inner crucible made of quartz and an outer crucible made of graphite.

4. The apparatus as set forth in claim 1, wherein an outside diameter of said partition is 60 to 90% of an outside diameter of said inner crucible.

5. The apparatus as set forth in claim 4, wherein the outside diameter of said partition is about 75% of the outside diameter of said inner crucible.

6. The apparatus as set forth in claim 1, wherein a thickness of said partition is 5 to 20 mm.

7. The apparatus as set forth in claim 6, wherein the thickness of said partition is 7 to 8 mm.

8. The apparatus as set forth in claim 1, further comprising means for introducing dopant in the crucible.

9. The apparatus as set forth in claim 1, wherein the setting means comprises at least one jig extending between an upper end of the partition and an upper end of the crucible.

10. The apparatus as set forth in claim 1, wherein the lower end of the partition includes a plurality of legs separated by open spaces therebetween.

11. The apparatus as set forth in claim 1, wherein an upper end of the partition is cylindrical and the lower end of the partition is frusto-conical in shape.

12. The apparatus as set forth in claim 11, wherein an upper end of the partition is cylindrical and the lower end of the partition decreases in diameter.

13. The apparatus as set forth in claim 11, wherein an upper end of the partition is cylindrical and the lower end of the partition increases in diameter.

14. The apparatus as set forth in claim 1, wherein the crucible is rotatable about an axis of rotation.

15. The apparatus as set forth in claim 14, wherein the crucible is movable up and down in a direction parallel to the axis of rotation.

* * * * *